(12) United States Patent
Kwok

(10) Patent No.: US 6,882,191 B2
(45) Date of Patent: Apr. 19, 2005

(54) RECTIFIER TYPE FREQUENCY DOUBLER WITH HARMONIC CANCELLATION

(75) Inventor: Sai Kwok, San Diego, CA (US)

(73) Assignee: M2 Networks, Inc., San Diego, CA (US)

(*) Notice: Subject to any disclaimer, the term of this patent is extended or adjusted under 35 U.S.C. 154(b) by 0 days.

(21) Appl. No.: 10/602,353

(22) Filed: Jun. 23, 2003

(65) Prior Publication Data

US 2004/0257129 A1 Dec. 23, 2004

(51) Int. Cl.[7] ............................................. H03B 19/00
(52) U.S. Cl. ..................................... 327/122; 327/113
(58) Field of Search ................................. 327/105, 113, 327/117, 119, 122, 115

(56) References Cited

U.S. PATENT DOCUMENTS

| | | | | |
|---|---|---|---|---|
| 3,710,146 A | * | 1/1973 | Ohsawa ........................ | 327/122 |
| 3,796,960 A | * | 3/1974 | Frizzell et al. ............... | 327/122 |
| 4,048,571 A | * | 9/1977 | Jacobson ...................... | 327/122 |
| 4,639,679 A | * | 1/1987 | Kasperkovitz et al. ....... | 327/122 |
| 4,931,921 A | | 6/1990 | Anderson ..................... | 363/163 |
| 5,434,522 A | * | 7/1995 | Fikart et al. ................. | 327/122 |
| 5,694,091 A | * | 12/1997 | Hennig ......................... | 331/76 |
| 6,348,830 B1 | | 2/2002 | Rebeiz et al. ................ | 327/355 |

FOREIGN PATENT DOCUMENTS

| | | | |
|---|---|---|---|
| DE | 10211523 | * | 7/2003 |
| JP | 362176308 | * | 8/1987 |

OTHER PUBLICATIONS

*Frequency Doublers*, http://www.minicircuits.com/appnote/doub9-2.html, Mini–Circuits, printed Oct. 25, 2001, Four (4) pages.

Hirasuna, Brian et al., *#PSPA023: Using Multipliers for Signal Processing*, http://www.pspice.com/upload/appnotes/PSPA023.html, printed Nov. 29, 2001, Three (3) pages.

IEEE Transactions on Circuits and Systems–I: Fundamental Theory and Applications, Sep. 1992, p. 773, vol. 39, No. 9.

Kimura, Katsuji et al., *Frequency Mixer with a Frequency Doubler for Integrated Circuits*, IEEE Journal of Solid-State Circuits, Sep. 1994, vol. 29, No. 9, pp. 1133–1137.

Kimura, Katsuji, *A Bipolar Four–Quadrant Analog Quarter–Square Multiplier Consisting of Unbalanced Emitter–Coupled Pairs and Expansions of Its Input Ranges*, IEEE Journal of Solid–State Circuits, Jan., 1994, p. 46, vol. 29, No. 1.

Laute, Dr. Andreas, *Upgrading a 434–MHz Transmitter IC to 868 MHz*, Applied Microwave & Wireless, Jul./Aug. 1988, pp. 68, 70, 72–73.

* cited by examiner

*Primary Examiner*—Dinh T. Le
(74) *Attorney, Agent, or Firm*—Fitch, Even, Tabin & Flannery

(57) ABSTRACT

A frequency multiplier circuit is provided that does not rely on filtering to remove unwanted harmonics and spurious content. In one implementation, a frequency doubler comprises a first rectifier doubler stage adapted to receive a first input signal having a first frequency and output a first rectified signal having multiple harmonics; a second rectifier doubler stage adapted to receive a second input signal having the first frequency and offset in phase from the first input signal and to output a second rectified signal, which has the multiple harmonics and is offset in phase from the first rectified signal; and a differential amplifier stage adapted to sum the first and second rectified signals to produce an output signal including a desired output harmonic having a frequency that is double the first frequency. The summing results in the substantial cancellation of unwanted output harmonics in the output signal.

26 Claims, 11 Drawing Sheets

RECTIFIER TYPE FREQUENCY DOUBLER WITH HARMONIC CANCELLATION

This patent document relates to the following patent document filed concurrently herewith, which is incorporated herein by reference: U.S. patent application Ser. No. 10/602,364, of Kwok; entitled POLY-PHASE NETWORK WITH RESONANT CIRCUIT BANDPASS SHAPING.

BACKGROUND OF THE INVENTION

1. Field of the Invention

The present invention relates generally to frequency multiplier circuits, and more specifically to frequency doubler circuits for producing a relatively pure output for use in radio equipment.

2. Discussion of the Related Art

In radio communications, in order to reduce the number of oscillators, it is desirable to multiply the frequency of a local oscillator to effectively derive another local oscillator. For example, a frequency doubler is a circuit that produces an output signal at the twice the frequency of the input signal, the input signal or fundamental frequency being suppressed from the output. Typically, frequency doubling is realized by feeding the input signal through nonlinear devices, such as diodes or transistors, and then extracting the doubled or first output harmonic and rejecting the other frequency components.

One common frequency doubler is a rectifier type doubler that rectifies and doubles an input signal, then uses complex LC filtering to remove the unwanted harmonics. However, it is very complicated to implement such filtering on an integrated circuit and to remove the unwanted harmonics and maintain low noise over a wide input signal level range, such as from −10 to 0 dBm. Additionally, due to poor inductor Q (quality factor) and grounding in an integrated circuit implementation, it is very difficult to achieve good filter response for proper harmonic and spurious rejection.

Another approach is an injection lock type doubler, which is known to be very unreliable, e.g., gets out of lock easily. Such injection lock type doublers also require complex filtering to reject unwanted harmonics and spurious content.

Another well known approach is an unbalanced multi-tanh doubler, which is an ideal frequency doubler that generates only the desired doubled harmonic. The unbalanced multi-tanh doubler includes unbalanced emitter-coupled differential pairs with emitter area ratio K and relies on current summation and cancellation. Again, complex filtering is required for the rejection of unwanted harmonics. Disadvantageously, this doubler has a limited dynamic range with acceptable noise output performance. Thus, it is not able to maintain a low distortion output for a wide range of input levels and amplitude fluctuations.

It is with respect to these and other background information factors that the present invention has evolved.

SUMMARY OF THE INVENTION

The present invention advantageously addresses the needs above as well as other needs by providing a frequency multiplier circuit that has a high dynamic range to maintain a low distortion output for a wide range of input levels and amplitude fluctuations that in many cases does not rely on filtering to remove unwanted harmonics and spurious content.

In one embodiment, the invention can be characterized as a frequency doubler device comprising a first rectifier doubler stage adapted to receive a first input signal having a first frequency and adapted to output a first rectified signal having multiple harmonics; a second rectifier doubler stage adapted to receive a second input signal having the first frequency and offset in phase from the first input signal and adapted to output a second rectified signal, wherein the second rectified signal has the multiple harmonics and is offset in phase from the first rectified signal; and a differential amplifier stage coupled to the first rectifier doubler stage and the second rectifier doubler stage and adapted to sum the first rectified signal and the second rectified signal to produce an output signal. The output signal includes a desired output harmonic having a frequency that is double the first frequency. The summing results in the substantial cancellation of unwanted output harmonics in the output signal.

In another embodiment, the invention can be characterized as a frequency multiplier device comprising a first rectifier stage adapted to receive a first input signal having a first frequency and adapted to output a first rectified signal having multiple harmonics; a second rectifier stage adapted to receive a second input signal having the first frequency and offset in phase from the first input signal and adapted to output a second rectified signal, wherein the second rectified signal has the multiple harmonics and is offset in phase from the first rectified signal; and a differential amplifier stage coupled to the first rectifier stage and the second rectifier stage and adapted to sum the first rectified signal and the second rectified signal to produce an output signal. The output signal includes a desired output harmonic having a frequency that is a multiple of the first frequency. The summing results in the substantially cancellation of unwanted output harmonics in the output signal.

In a further embodiment, the invention may be characterized as a method of frequency multiplication comprising the steps of: doubling a first input signal having a first frequency to produce a first doubled signal having a second frequency and multiple harmonics, the second frequency approximately twice the first frequency; doubling a second input signal having the first frequency and offset in phase from the first input signal to produce a second doubled signal, wherein the second doubled signal has the second frequency and the multiple harmonics and is offset in phase from the first doubled signal; and summing the first doubled signal and the second doubled signal to produce an output signal including a desired output harmonic having the second frequency, wherein the summing results in the substantial cancellation of unwanted output harmonics in the output signal.

In yet another embodiment, the invention may be characterized as a method of frequency multiplication comprising the steps of: multiplying a first input signal having a first frequency to produce a first multiplied signal having a second frequency and multiple harmonics, the second frequency a multiple of the first frequency; multiplying a second input signal having the first frequency and offset in phase from the first input signal to produce a second multiplied signal, wherein the second multiplied signal has the second frequency and the multiple harmonics and is offset in phase from the first multiplied signal; and summing the first multiplied signal and the second multiplied signal to produce an output signal including a desired output harmonic having the second frequency, wherein the summing results in the substantial cancellation of unwanted output harmonics in the output signal.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION

The following description is not to be taken in a limiting sense, but is made merely for the purpose of describing the general principles of the invention. The scope of the invention should be determined with reference to the claims.

Generally an improved frequency multiplier circuit (e.g., a frequency doubler) is described with reference to FIGS. 1–6 while an improved polyphase network (e.g., for use in one embodiment of the improved frequency multiplier circuit) is described with reference to FIGS. 7A–11.

According to several embodiments of the invention, a frequency multiplier circuit is provided that does not require filtering for rejection. According to several embodiments, the input signal to be multiplied, e.g., doubled, is passed through a polyphase network, which produces two signals having the same frequency but offset in phase. Next, in a frequency doubler, each input signal is doubled using a known rectifier type doubler for each input signal, then the resulting doubled and phase offset outputs are combined using a differential amplifier to harmonically cancel the unwanted harmonics, e.g., even output harmonics are canceled. Advantageously, in embodiments where the presence of odd output harmonics is not harmful, this multiplier circuit does not require filtering for harmonic rejection. Furthermore, in embodiments where the presence of odd output harmonics is harmful, less filtering is required for harmonic rejection.

Figure 1:
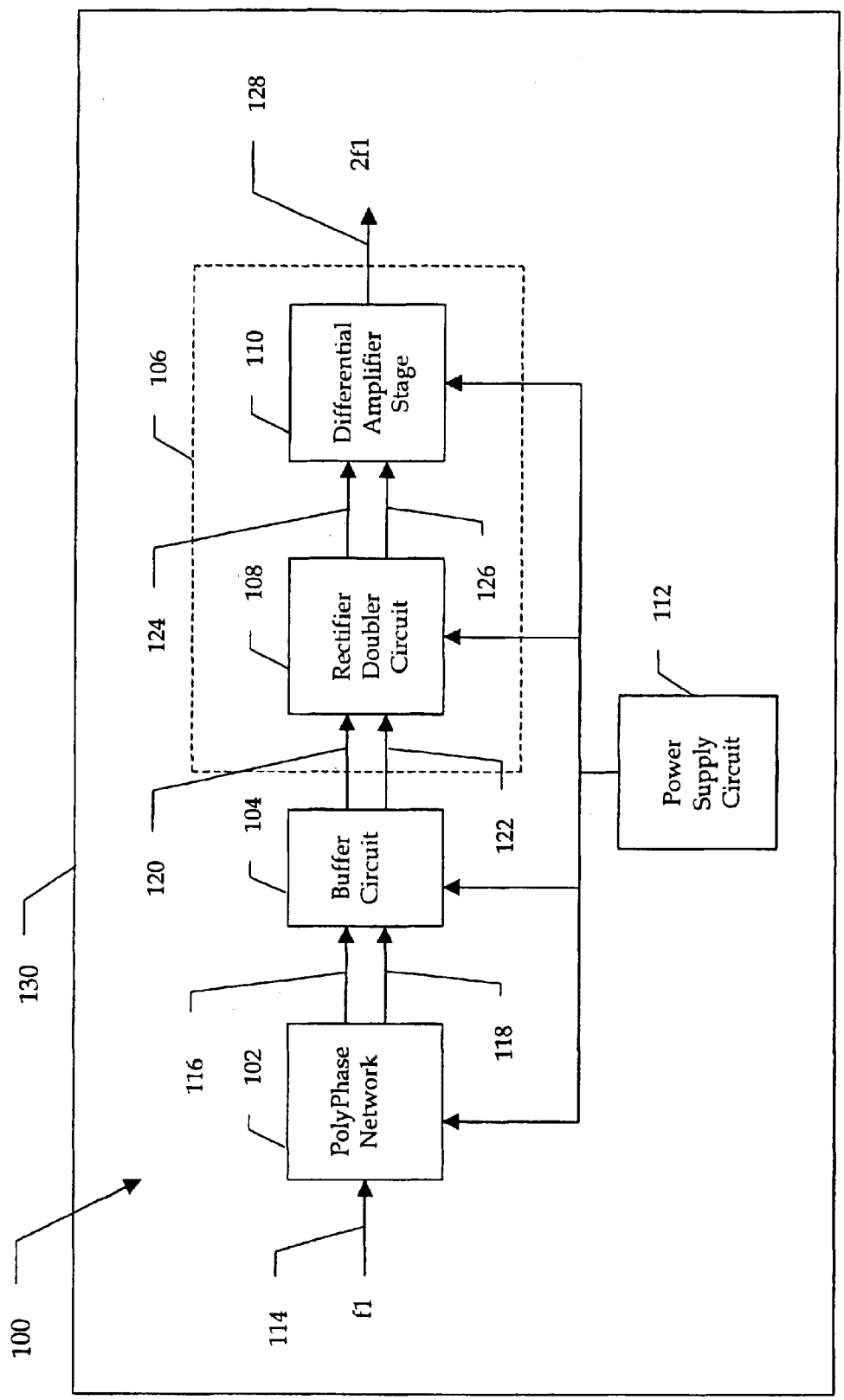
FIG. 1 is a simplified functional block diagram of a frequency doubler according to one embodiment of the invention.

Referring first to FIG. 1, a simplified functional block diagram is shown of a frequency doubler according to one embodiment of the invention. The frequency doubler 100 (generically referred to as a frequency multiplier) includes a polyphase network 102 (e.g., an R-C polyphase network, polyphase filter or phase-sequence network), an optional buffer 104, a frequency doubler portion 106 (generically referred to as the frequency multiplier portion) including a rectifier doubler circuit 108 and a differential amplifier stage 110, and a power supply circuit 112. Also, illustrated are the various signals including an input signal 114 at frequency f1 and an output signal 128 at frequency 2f1. In this illustrated embodiment, the frequency doubler 100 is implemented within an integrated circuit device 130 (also referred to as IC device 130). It is understood that while in preferred form, a frequency doubler is described, it is understood that the multiplier circuit may be adapted to multiply the input frequency other than by two, e.g., quadrupled, etc.

Input signal 114, for example, a sinusoidal signal from an oscillator (such as a local oscillator of a radio frequency (RF) device), is to be multiplied. As is well known in the art, a local oscillator typically includes a crystal oscillator, which produces a signal having a known frequency f1. However, it is often desired to utilize multiples of the frequency f1 in other portions of the RF device. For example, a frequency doubler will produce an output that is twice that of its input, i.e., 2f1.

According to one embodiment, input signal 114, for example, a sinusoidal signal from an oscillator (such as a local oscillator of a radio device), is input to the polyphase network 102. In this embodiment, the input signal is a differential signal having a frequency of 2.1 GHz. It is noted that the input signal may have any desired frequency and that 2.1 GHz is used by way of example. The polyphase network 102 outputs two signals offset in phase from each other. In preferred embodiments, the two output signals 116 and 118 are in quadrature phase, i.e., signals 116 and 118 have the same frequency as input signal 114, but are offset in phase by approximately 90 degrees.

Any R-C polyphase network as understood in the art may be used; however, as described further below, in preferred embodiments, an improved polyphase network is implemented which provides better performance than conventional polyphase networks. Such an improved polyphase network is described with reference to FIGS. 7A–11.

Next, the signals 116 and 118 are buffered by buffer circuit 104 and output as signals 120 and 122. Thus, signals 120 and 122 are differential signals having the same frequency as signals 114, 116, 118 but are offset in phase by approximately 90 degrees. The buffer circuit 104 may be any known buffer circuit and provides good isolation for the oscillator providing the input signal 114. In some embodiments, the buffer circuit 104 also protects the polyphase network 102 from any impedance changes in the later stages of the circuit. It is noted that a buffer circuit is not required to practice a frequency doubler in accordance with the invention. For example, in some implementations, the buffer circuit 104 is eliminated. In embodiments without a buffer circuit 104, signals 116 and 120 are identical and signals 118 and 122 are identical.

Signals 120 and 122 are input to the frequency doubler portion 106, which produces an output signal 128 that is twice the frequency of input signal 114. Thus, the output signal 128 includes the desired $1^{st}$ output harmonic of the input signal, the fundamental frequency f1 being suppressed. For example, in one embodiment, the output signal 128 includes a differential signal having a frequency of 4.2 GHz.

According to several embodiments of the invention, the frequency doubler portion 106 includes the rectifier doubler circuit 108 and the differential amplifier stage 110. Each of signals 120 and 122 is input to a respective rectifier type frequency doubler of the rectifier doubler circuit 108, which outputs signals 124 and 126. Signals 124 and 126 are rectified differential signals that are doubled in frequency in comparison to signals 120 and 122. Again, signals 124 and 126 are quadrature signals designed to be offset in phase by 90 degrees. The functionality and implementation of the rectifier type frequency doublers within the rectifier doubler circuit 108 is well known in the art.

However, it is well known with rectifier type frequency doublers that the signals 124 and 126 are rich with harmonics, in particular, even output harmonics relative to the desired harmonic output, e.g., the $2^{nd}$, $4^{th}$, $6^{th}$ and $8^{th}$ output harmonics. Rather than using complex L-C filtering to remove the even output harmonics and spurious content, according to several embodiments, signals 124 and 126 are summed together by the differential amplifier stage 110. Advantageously, the differential amplifier stage 110 cancels the even output harmonics relative to the desired output harmonic and generates signal 128 which is a relatively pure sine wave having double the frequency of the input signal 114. It is noted that the signals 124 and 126 include odd output harmonics, e.g., the $1^{st}$, $3^{rd}$, $5^{th}$ and $7^{th}$ output harmonics. The $1^{st}$ output harmonic is the desired harmonic output having twice the frequency of the input signal 114. Thus, as a departure from the known art, the frequency doubler may be easily implemented on the integrated circuit device 130. Furthermore, the frequency doubler may be implemented without requiring expensive and difficult to implement L-C filtering in embodiments in which the presence of additional odd harmonics is not harmful. Thus, in these embodiments, the problem of implementing high performance on chip LC filters due to poor inductor quality is entirely avoided. Further advantageously, the frequency doubler according to several embodiments has a high dynamic range which maintains a low distortion output for a wide range of input levels and amplitude fluctuations. It is noted that in embodiments where the presence of additional odd output harmonics in the output signal is harmful, less LC filtering is required than is traditionally known since the even output harmonics are substantially canceled without filtering, i.e., only the unwanted odd output harmonics need to filtered.

It is noted that as would be expected, the cancellation mechanism in the differential amplifier stage 110 is sensitive to phase input and signal quality. For example, in order for the frequency doubler portion 106 to perform optimally, the input signals 120 and 122 should have very little phase error. For example, in one implementation, phase error between the quadrature inputs should be less than 2 degrees. In this implementation, phase error greater than 2 degrees may not completely cancel the unwanted output harmonics. However, it is noted that 2 degrees as used above is by way of example and that in other implementations, more or less phase error may result in the unwanted output harmonics not being sufficiently canceled.

Thus, a high quality R-C polyphase network implementation should be employed as the polyphase network 102. As such, in preferred embodiments and as will be described in detail below with reference to FIGS. 7A–11, the polyphase network is placed at the collector of the driving transistor device and a shunt inductor is added in resonance with its capacitive reactance to provide bandpass shaping. Advantageously, the polyphase network according to several embodiments of the invention helps to reject incoming undesirable spurious content and harmonics. Furthermore, this polyphase network reduces circuit complexity and power consumption, as well as improves phase performance in comparison to traditional approaches. Thus, such a polyphase network provides very clean input sinusoidal signals 116 and 118 having little phase error for input to the frequency doubler portion 106. This ensures that the differential amplifier stage 110 will work optimally to harmonically cancel the unwanted even harmonics relative to the desired harmonic in signal 128.

It should be noted that in many embodiments, the frequency doubler portion 106 will work with any known polyphase network or other polyphase device, e.g., a simple flip flop or a conventional R-C polyphase network at the emitter of the driving transistor device(s); however, in applications having stringent requirements (e.g., wireless indoor communications), the frequency doubler portion 106 of several embodiments works optimally best with a polyphase network that provides a clean output that has very little phase error.

The power supply circuit 112 is a centralized power supply that provides DC power to the various stages and circuits of FIG. 1 as well as the bias currents for operation of the transistor devices contained therein. The temperature characteristics of the power supply circuit 112 are optimized to provide appropriate current for each stage in avoiding saturation and SNR reduction. Such a power supply circuit 112 is well known in the art and is thus, not further described.

In one embodiment, such a frequency doubler 100 is implemented within a pre-mixer stage that is used as an input to a mixer. For example, the output signal 128 may pass through another polyphase network (used for image rejection in the subsequent mixer stage), then another buffer circuit (for impedance isolation) and finally a pulse shaping circuit prior to being input to the mixer. It should be understood that the output of such a frequency multiplier circuit may be used for other purposes than as an input to a mixer.

Figure 2:
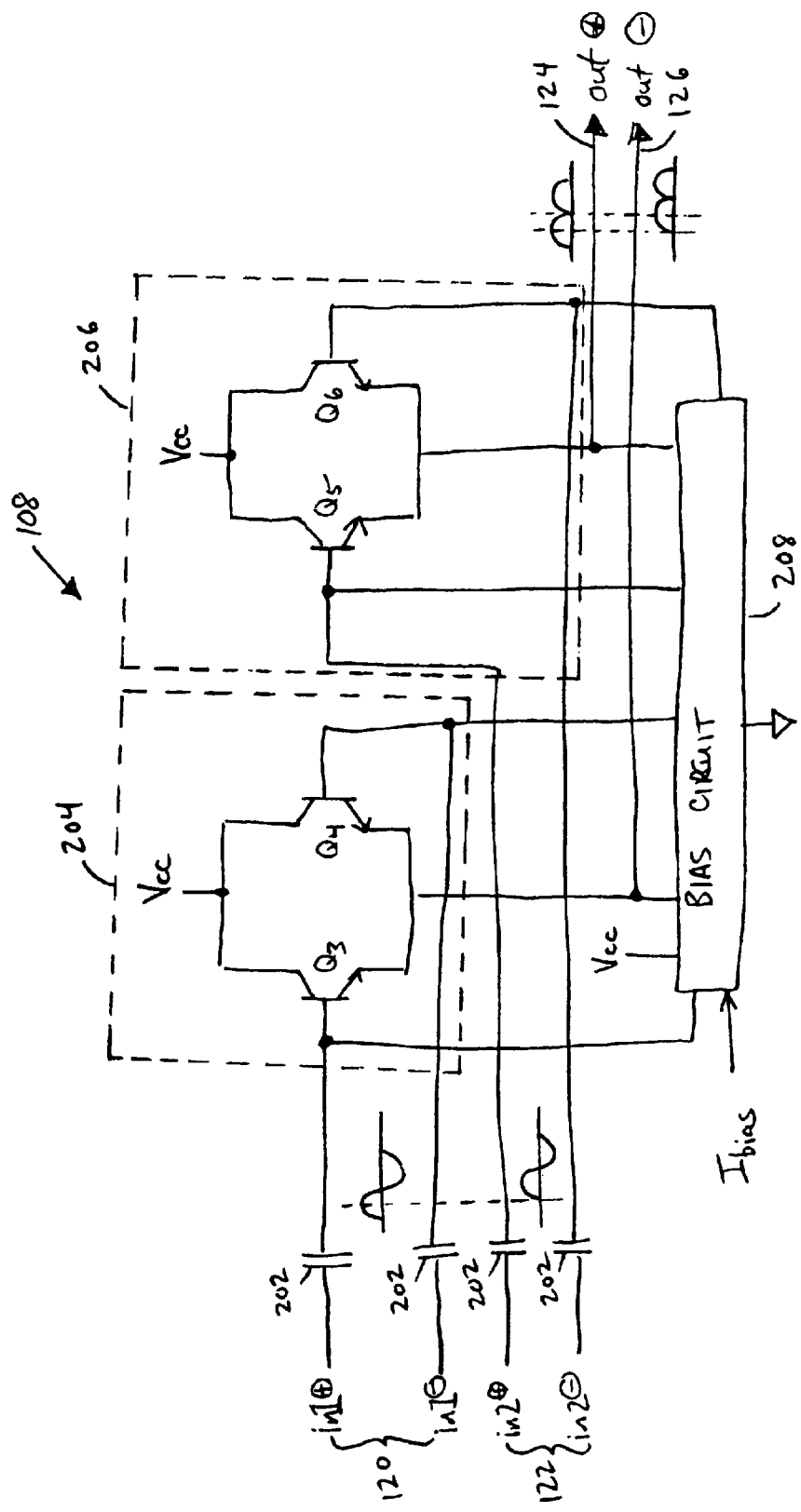
FIG. 2 is a circuit diagram of a double rectifier-type frequency doubler circuit of the frequency doubler of FIG. 1 in accordance with one embodiment of the invention.

Referring next to FIG. 2, a circuit diagram is shown of a double rectifier-type frequency doubler circuit 108 of a frequency doubler 100 of FIG. 1 in accordance with one embodiment of the invention. Shown are signals 120 and 122, coupling capacitors 202, a first rectifier type frequency doubler stage 204 (also referred to as a first rectifier doubler stage and generically referred to as a first rectifier stage), a second rectifier type frequency doubler stage 206 (also referred to as a second rectifier doubler stage and generically referred to as a second rectifier stage), a bias circuit 208 and output signals 124 and 126.

As illustrated, the input signals 120 and 122 are shown as sinusoidal waveforms offset by approximately 90 degrees to each other. The coupling capacitors 202 act to AC couple the rectifier doubler stages to the previous stage and to block any DC components. Each rectifier doubler stage 204 and 206 is a differential pair including two transistors with emitter outputs as a rectification circuit. For example, the first rectifier doubler stage 204 includes transistors Q3 and Q4 while the second rectifier doubler stage 206 includes transistors Q5 and Q6. Input signals 120 and 122 are coupled to the base of the respective ones of Q3, Q4, Q5 and Q6, while Vcc provides DC voltage to the collectors of the transistors and to the bias circuit 208. The bias circuit 208 inputs bias current $I_{bias}$ from the power supply circuit 112 to provide the proper bias currents at the base of each transistor to cause each rectifier double stage 204 and 206 to become a current source and to ensure the proper switching between Q3 and Q4 as well as between Q5 and Q6. The operation of these rectifier doubler stages and the proper bias circuit is well understood in the art, and is thus not described further. As is known, the output signal 124 is taken off of the emitter of the first rectifier doubler stage 204, while output signal 126 is taken from the emitter of the second rectifier doubler stage 206. Signals 124 and 126 are rectified signals having double the frequency of the input signals 120 and 122, as illustrated in FIG. 2. However, each of these signals 124 and 126 remain offset in phase by approximately 90 degrees with respect to each other, as shown in the illustrated output waveforms.

As is well known in the art, the output of rectifier type doublers is rich in harmonics. For example, the fundamental frequency (input signal) has been suppressed and each output 124 and 126 includes the desired doubled output harmonic and other odd and even output harmonics. It is generally known that in many applications, the even output harmonics are harmful, while odd output harmonics are not. Given an input signal having frequency $f_1(t)$ where:

$$f_1(t) = A\cos(\omega t) \qquad \text{Eq. (1)}$$

where A is the amplitude (assuming A=1), $\omega$ is the angular frequency (where $\omega = 2\pi f$), and assuming $f=2$ GHz, then the Fourier series of a rectified and doubled signal $f_2$ (t) (e.g., signal 124) is as follows:

$$f_2(t) = \frac{2A}{\pi} + \frac{4A}{\pi}\sum_{n=1}^{\infty} \frac{1}{1-4n^2}\cos(2n\omega t) \qquad \text{Eq. (2)}$$

where n is the output harmonic index. The Fourier series expansion of Eq. (2) can be expressed as:

$$f_3(t) = \frac{2A}{\pi} - \frac{4A}{\pi} \qquad \text{Eq. (3)}$$
$$\left(\frac{1}{3}\cos(2\omega t) + \frac{1}{15}\cos(4\omega t) + \frac{1}{35}\cos(6\omega t) + \frac{1}{63}\cos(8\omega t) + \cdots\right)$$

Based on this Fourier series expansion, the output harmonics can be calculated to be −14dBc, −21dBc and −26dBc for the $2^{nd}$, $3^{rd}$ and $4^{th}$ output harmonic levels respectively, which has been verified in a SPICE simulation.

At this point, a conventional frequency doubler using complex LC filters is used to remove or suppress the unwanted output harmonics (e.g., the $2^{nd}$, $4^{th}$ and $6^{th}$ harmonics or even harmonics). In contrast, according to several embodiments of the invention, the signals 124 and 126 are summed by the differential amplifier circuit of FIG. 3 as described below to harmonically cancel the unwanted even output harmonics. In applications where the presence of odd output harmonics is harmful in the output signal, LC filtering would be needed to filter such harmonics; however, less LC filtering is needed since the unwanted even output harmonics are harmonically canceled.

Figure 3:
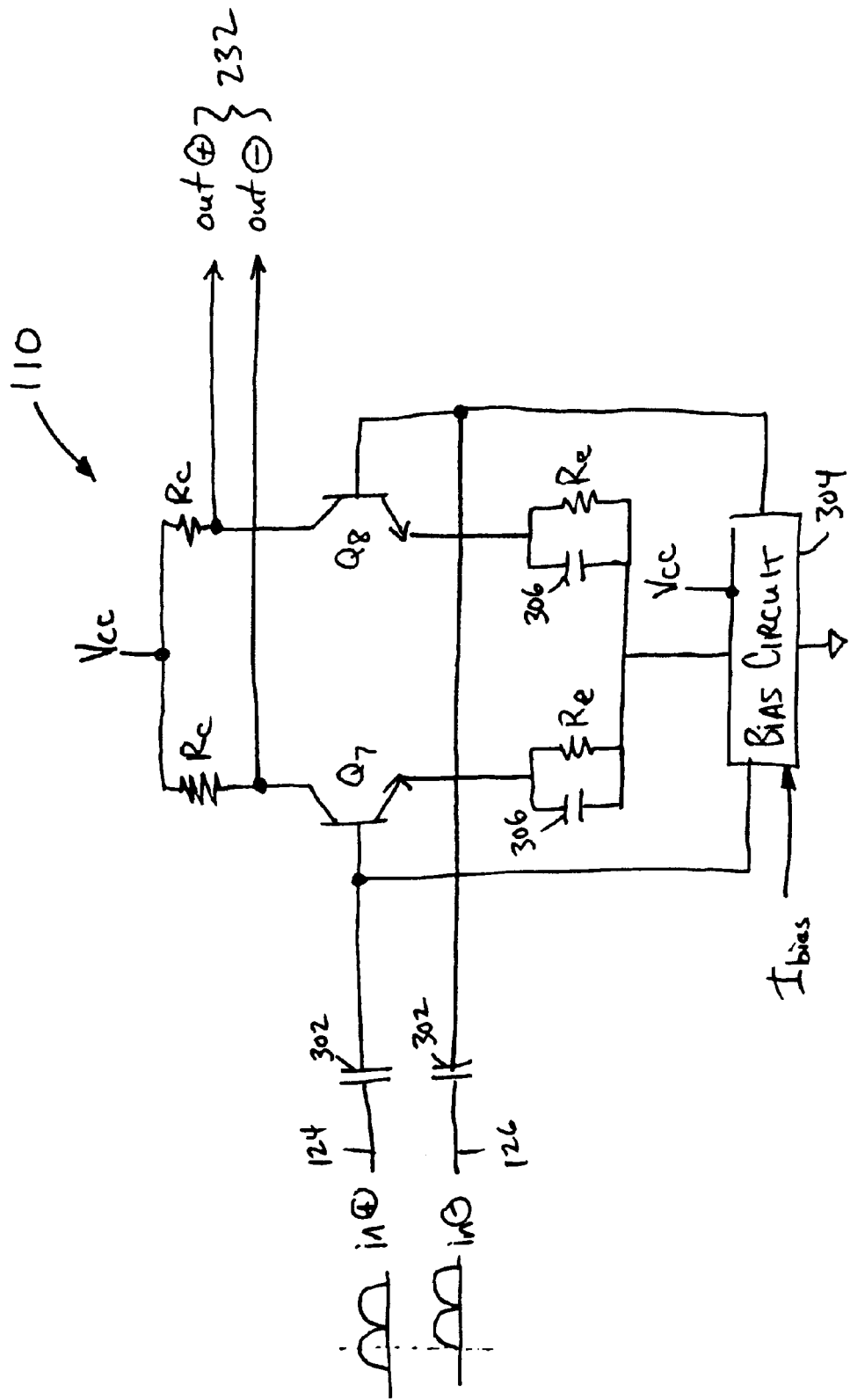
FIG. 3 is a circuit diagram of a differential amplifier circuit of the frequency doubler of FIG. 1 in accordance with one embodiment of the invention.

Referring next to FIG. 3, a circuit diagram is shown of a differential amplifier stage 110 of the frequency doubler portion 106 of FIG. 1 in accordance with one embodiment of the invention. Shown are signals 124 and 126, coupling capacitors 302, a differential pair comprising transistors Q7 and Q8, collector resistors Rc, emitter resistors Re, a bias circuit 304, capacitors 306 and output signal 128.

As illustrated, coupling capacitors 302 act to AC couple the outputs of the rectifier doubler circuit 108 to the differential amplifier stage 110. As is well known, the differential amplifier stage 110 includes two transistor devices Q7 and Q8. Input signals 124 and 126 (rectified and doubled signals offset in phase by approximately 90 degrees) are coupled to the base of the respective ones of Q7 and Q8, while Vcc and Rc provides DC voltage to the collectors of the transistors and to the bias circuit 304. The bias circuit 304 inputs the appropriate bias current $I_{bias}$ from the power supply circuit 112 to provide the proper bias currents at the base of each transistor Q7 and Q8 to cause the transistors to become current sources. It is noted that a small value capacitor 306 has been added in parallel to each emitter resistor Re to compensate for tolerance changes. This helps to ensure good matching between the transistor pair over process tolerance. The output of the differential amplifier stage 110 is taken at the collector of each transistor Q7 and Q8 as signal 128. As is well known in a differential pair, when the transistors Q7 and Q8 are conducting, signal 128 is the summation of input signals 124 and 126, e.g., signal 128 is the result of the difference between signals 124 and 126. The operation of the differential pair stage 110 and the proper bias circuit 304 needed to operate transistors Q7 and Q8 is well understood in the art.

Figure 4:
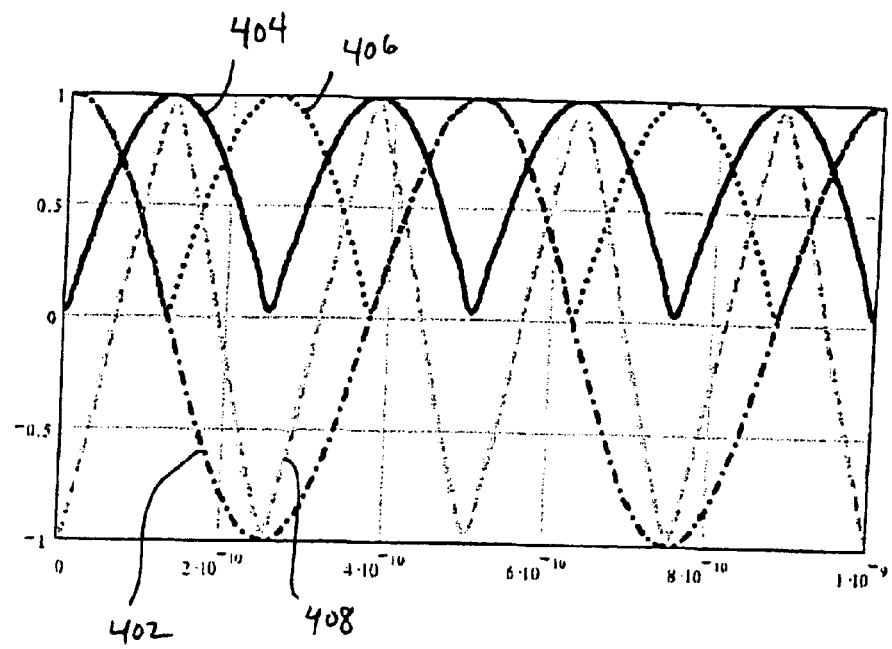
FIG. 4 is an illustration of various waveforms of the frequency rectifier doubler circuit and the differential amplifier stage of the frequency doubler of FIGS. 2 and 3 in accordance with one embodiment of the invention.

Referring briefly to FIG. 4, an illustration is shown of various waveforms of the double rectifier doubler circuit 108 and the differential amplifier stage 110 of FIGS. 2 and 3 in accordance with one embodiment of the invention.

As described above, given an input sine wave $f_1(t)$ of Eq. (1), and rectified signal $f_2(t)$ 124 from the first rectifier doubler stage 204:

$$f_2(t) = \frac{2A}{\pi} + \frac{4A}{\pi}\sum_{n=1}^{\infty} \frac{1}{1-4n^2}\cos(2n\omega t) \qquad \text{Eq. (4)}$$

and rectified signal $f_3(t)$ 126 from the second rectifier doubler stage 206 that is offset approximately 90 degrees in phase from $f_2(t)$:

$$f_3(t) = f_2\left[t - \left(\frac{1}{4f} - \frac{\text{phase offset}}{360f}\right)\right]10^{\frac{amp\ offset}{20}} \qquad \text{Eq. (5)}$$

where phase offset and amp offset are the phase offset and amplitude offset between signals 124 and 126, i.e., $f_2(t)$ and $f_3(t)$.

As illustrated in FIG. 4, the sine wave of $f_1(t)$ is illustrated as waveform 402, and the rectified and frequency doubled signals $f_2(t)$ and $f_3(t)$ are illustrated as waveforms 404 and 406, respectively, as output from the rectifier doubler stages 204 and 206. Further illustrated is the output of the differential amplifier stage 110 or $f_4(t)$ is illustrated as waveform 408 where:

$$f_4(t) = f_2(t) - f_3(t) \qquad \text{Eq. (6)}$$

As can be clearly seen in FIG. 4, waveform 408 is a sinusoidal signal that represents the signal 128 as output from the differential amplifier stage 110 and has twice the frequency of the input signal 114, which is represented by waveform 402.

Figure 5:
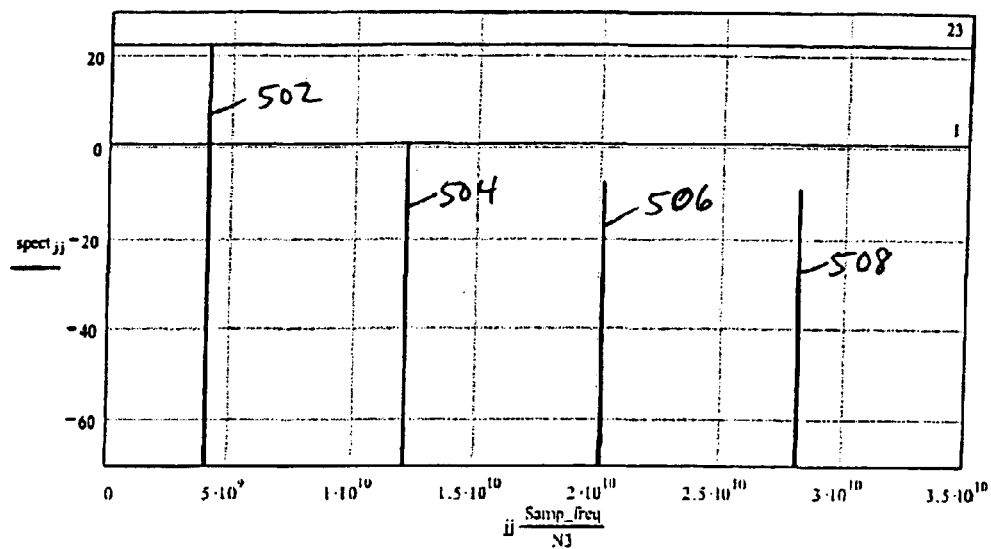
FIG. 5 is a plot of the power spectrum vs. frequency of the output of the frequency doubler of FIGS. 1–3 illustrating the harmonic cancellation of the unwanted harmonic frequencies.

Referring next to FIG. 5, a plot is shown of the power spectrum vs. frequency of the output of the frequency doubler of FIGS. 1–3 illustrating the harmonic cancellation of the unwanted even output harmonic frequencies. In this embodiment, given an input signal at 2 GHz, the desired output harmonic 502 (i.e., the $1^{st}$ output harmonic) is illustrated at 4 GHz. Note that the fundamental frequency at 2 GHz has been suppressed. Also illustrated are the additional odd output harmonics, e.g., the $3^{rd}$ output harmonic 504 (e.g., at 12 GHz), the $5^{th}$ output harmonic 506 (e.g., at 20 GHz) and the $7^{th}$ output harmonic 508 (e.g., at 28 GHz). In this example, the $3^{rd}$, $5^{th}$ and $7^{th}$ output harmonics 504, 506, 508 are about 21 dBc, 30 dBc and 32 dBc lower, respectively, than the desired output harmonic 502.

Advantageously, since the signals 124 and 126 are offset in phase, the summation of signals 124 and 126 substantially cancels the even output harmonics. For example, harmonic outputs at 8 GHz, 16 GHz, 24 GHz and 32 GHz are not shown in FIG. 5. These harmonics are the even output harmonics (i.e., the $2^{nd}$, $4^{th}$, $6^{th}$ and $8^{th}$ output harmonics). Advantageously, these even harmonics are canceled or suppressed without the use of complex LC filters. This enables a simpler integrated circuit (IC) implementation since both the rectifier doubler circuit 108 and the differential amplifier stage 110 are easily implemented on an IC device 130. It is noted that in embodiments in which the presence of odd output harmonics is not desired in the output signal, additional LC filtering should be used to remove the remaining unwanted output harmonics as is known in the art. However, less LC filtering is required in such embodiments relative to traditional frequency doubler approaches, since the even output harmonics have been canceled.

In actual use, it is noted that the even output harmonics are actually present in the output signal 128; however, these even output harmonics are suppressed considerably relative to the power of the desired output harmonic 502, i.e., for all practical purposes, the unwanted even output harmonics are substantially canceled. For example, in a SPICE simulation, the harmonic cancellation of the $2^{nd}$ output harmonic (i.e., the output harmonic at 8 GHz) is 42 dBc, while the $3^{rd}$ output harmonic 504 at 12 GHz is 46 dBc lower than the desired output harmonic 502. For most applications, such levels of reduction are more than adequate and are considered cancellation. Thus, according to one embodiment, the summation of signals 124 and 126 results in at least a 20 dBc reduction, more preferably, at least a 30 dBc reduction, and most preferably, at least a 40 dBc reduction in one or more unwanted harmonics of the output signal. In particular, the summation of signals 124 and 126 results in at least a 20 dBc reduction, more preferably, at least a 30 dBc reduction, and most preferably, at least a 40 dBc reduction in a first even output harmonic relative to the desired harmonic output. Preferably, the reduction levels above occur to all unwanted even output harmonics.

In one embodiment, the input frequency range is 2.1–2.2 GHz, the input signal range is from −10 to 0 dBm, the output phase noise must be less than −150 dBc/Hz, the 6 GHz spurious output must be less than −38 dBc, the frequency doubling phase noise degradation should be within a 2 degree accuracy, and the output level variation should be less than 2 dB. Such a doubler circuit described herein will operate under such conditions without requiring LC filters to remove unwanted output harmonics. The system parameters described are by way of example, and it is understood that in other embodiments, the frequency doubler circuit may be implemented in a system having different requirements.

Advantageously, the frequency doubler portion 106 of this embodiment is useful for mixer LO operation or any other application which requires frequency multiplication. It is further understood that one of skill in the art could further multiply the signal output from the frequency doubler to effectively multiply, e.g., quadruple, the frequency of the input signal. For example, another frequency doubler stage may be cascaded at the output of frequency doubler portion 106 to produce a signal having a frequency quadruple that of the input signal.

Figure 6:
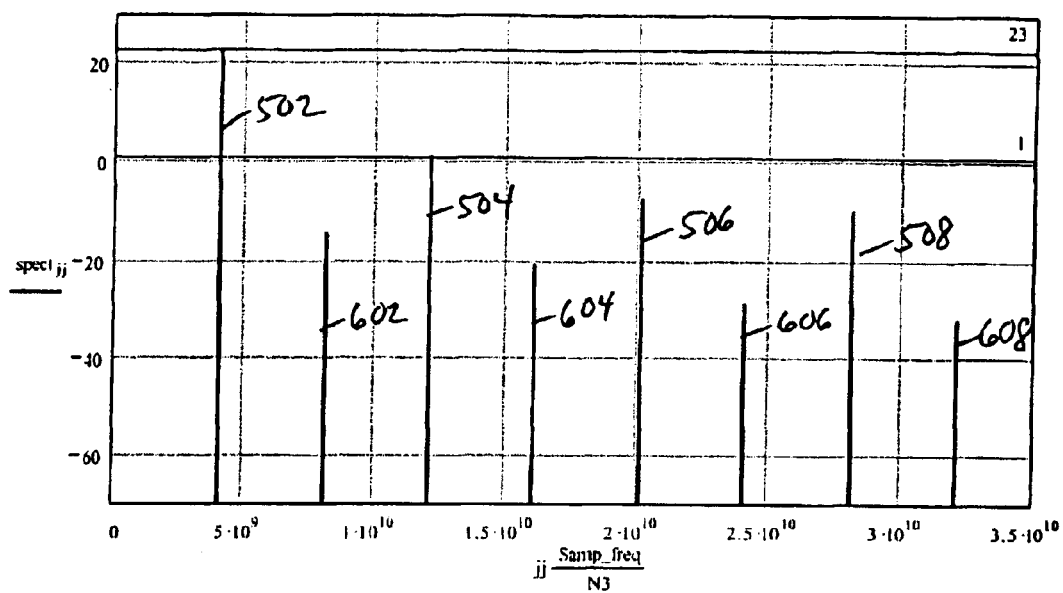
FIG. 6 is a plot is shown of the power spectrum vs. frequency of the output of the frequency doubler of FIGS. 1–3 when a phase offset of 2 degrees is present between the quadrature inputs to the rectifier doubler circuit of FIG. 2.

Additionally, it is noted that the cancellation mechanism of the rectifier doubler circuit 108 and the differential amplifier is sensitive to phase input and signal quality. Referring to FIG. 6, a plot is shown of the power spectrum vs. frequency of the output of the frequency doubler of FIGS. 1–3 when a phase offset of 2 degrees is present between the quadrature inputs to the rectifier doubler circuit 108. In this case, since the phase offset is 2 degrees offset from 90 degrees, the $2^{nd}$ output harmonic 602 (at 8 GHz), the $4^{th}$ output harmonic 604 (at 16 GHz), the $6^{th}$ output harmonic 606 (at 24 GHz) and the $8^{th}$ output harmonic 608 (at 32 GHz) are illustrated. Such a plot is similar to the output of the rectifier doubler circuit 108 illustrated in FIG. 5 except that the unwanted or even output harmonics 602, 604, 606 and 608 are higher. Thus, in preferred embodiments, it is desired that a high quality R-C polyphase network, such as that described with reference to FIGS. 7A–11, be employed which provides a very clean sinusoidal output having very little phase offset, e.g., less than 2 degrees.

It is also understood that although the performance requirements to be met in the preferred embodiments are quite stringent, in other applications with less stringent requirements, such a frequency doubler portion 106 may be used with any known polyphase network and produce an acceptable output at double the frequency of the input signal.

Next, an improved polyphase network is described, which may be used for example, in the frequency multiplier circuits described above. Initially, referring to FIG. 7A, a conventional R-C polyphase network as known in the art is illustrated. The R-C polyphase network 700 (also known in the art as a "polyphase filter" or a "phase-sequence network") is illustrated as a two-stage (or two-pole) network having an input signal 702 (illustrated in positive and negative portions) and four quadrature outputs 708 (e.g., 0, 90, 180 and 270 degrees). Although the network 700 is illustrated as a two-stage network having stages 704 and 706, it is understood that an R-C polyphase network may include one or more R-C stages, e.g., a four stage R-C polyphase network. The R-C polyphase network 700 is a cyclic repetitive structure of equal resistors R and geometrically decreasing capacitors (e.g., c, c/2). That is, in each stage of the network, a resistor is serially connected between its input and output and a capacitor is connected between the input of one stage and the output of an adjacent stage.

Typically, a conventional polyphase network is driven by the emitter follower (EF) stage of a bipolar junction transistor (BJT), which provides a low impedance input to the polyphase network 700. In other words, each input of the polyphase network 700 is taken at the emitter of a respective transistor. In conventional polyphase networks, if the input signal is not clean, the outputs will include undesirable harmonics and spurious content. For example, the phase offset from the desired 90 degrees may be calculated to be as much as 7 degrees in a non-clean incoming signal or sine wave having a 20 dBc harmonic present. Additionally, in an application using the polyphase network 700 for image rejection for a mixer, exact quadrature is important. For example, a polyphase network producing quadrature outputs that are 4 degrees offset and having a 0.5 dB magnitude imbalance can degrade image rejection to 27 dBc. The structure and operation of an R-C polyphase network such as illustrated in well known in the art.

Figure 7A:
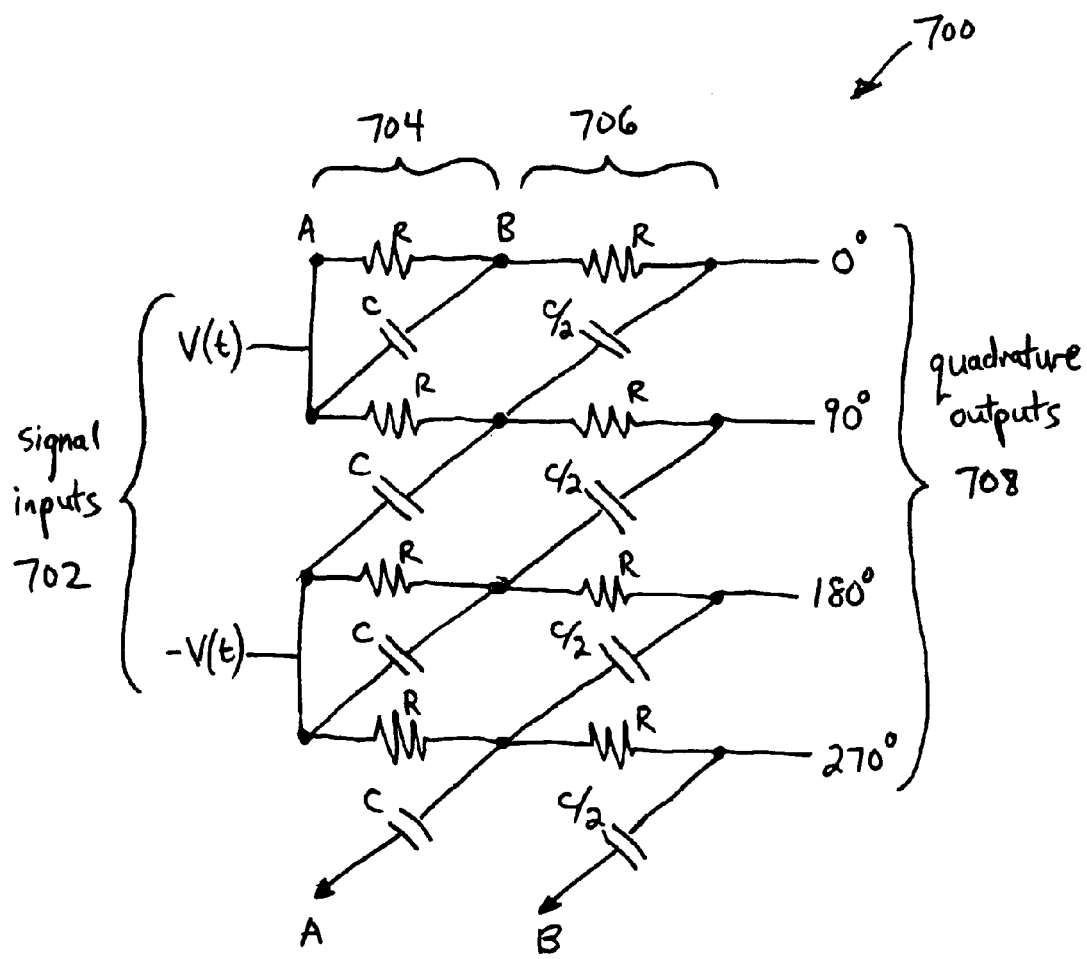
FIG. 7A is a circuit diagram of a conventional R-C polyphase network as known in the art.
Figure 7B:
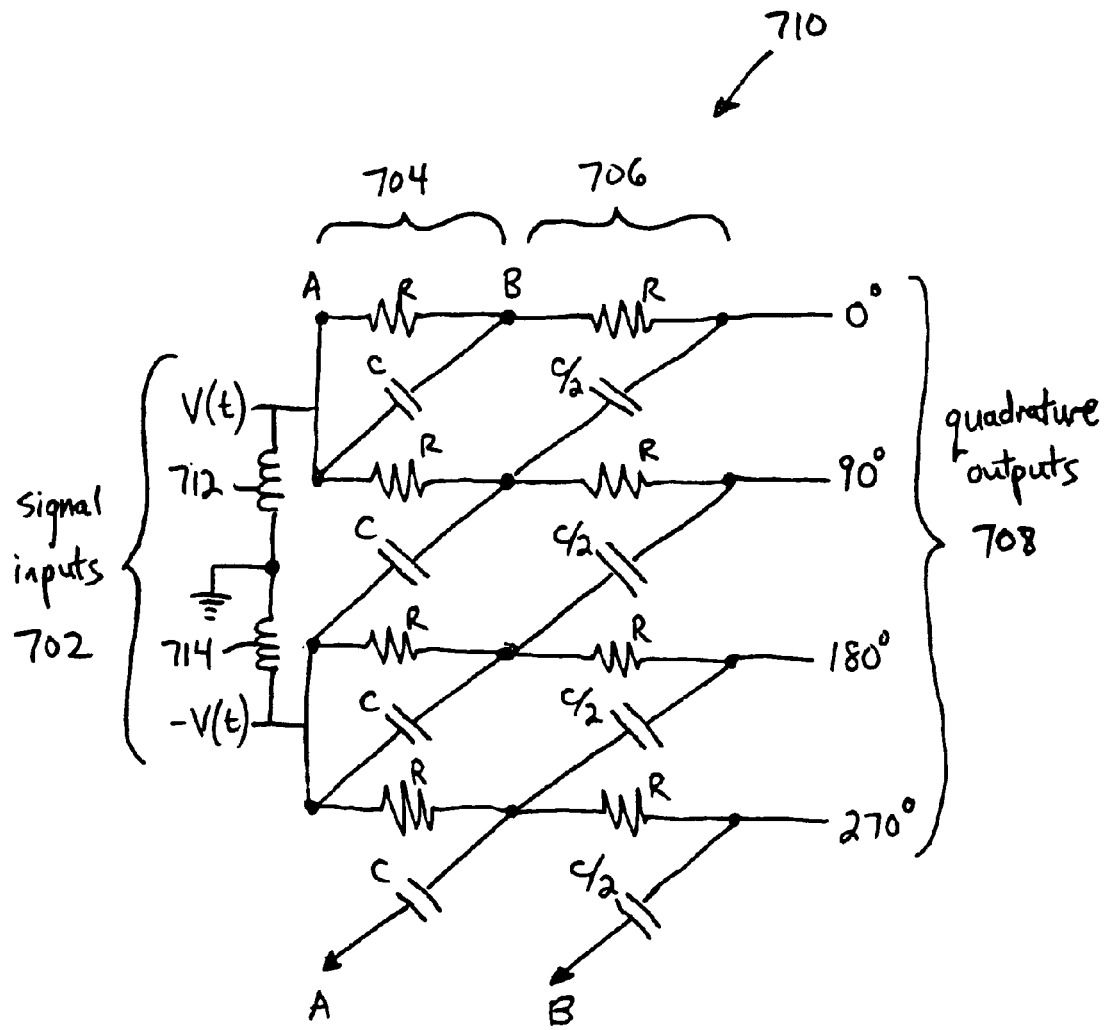
FIG. 7B is a circuit diagram of an R-C polyphase network according to one embodiment of the invention.

Referring next to FIG. 7B, a circuit diagram is shown of an R-C polyphase network according to one embodiment of the invention. In this embodiment of the R-C polyphase network 710, an inductor is coupled in parallel to each input of the network 710. For example, as illustrated, inductors 712 and 714 are coupled in parallel to the positive and negative portions of the input signal 702, respectively. As is described in more detail below, when the input to the network 710 is at a high impedance, e.g., when the input 702 of the R-C polyphase network 710 is coupled to the collectors of the driving transistors in a common emitter configuration, the inductors are selected to be in resonance with the capacitive reactance of the R-C polyphase network 710 in order to add bandpass filtering in the output 708. This is in contrast to the low pass response of the traditional R-C polyphase network. Additionally, locating the polyphase network 710 at the collectors of the driving transistors provides amplification in the output 708.

Figure 8:
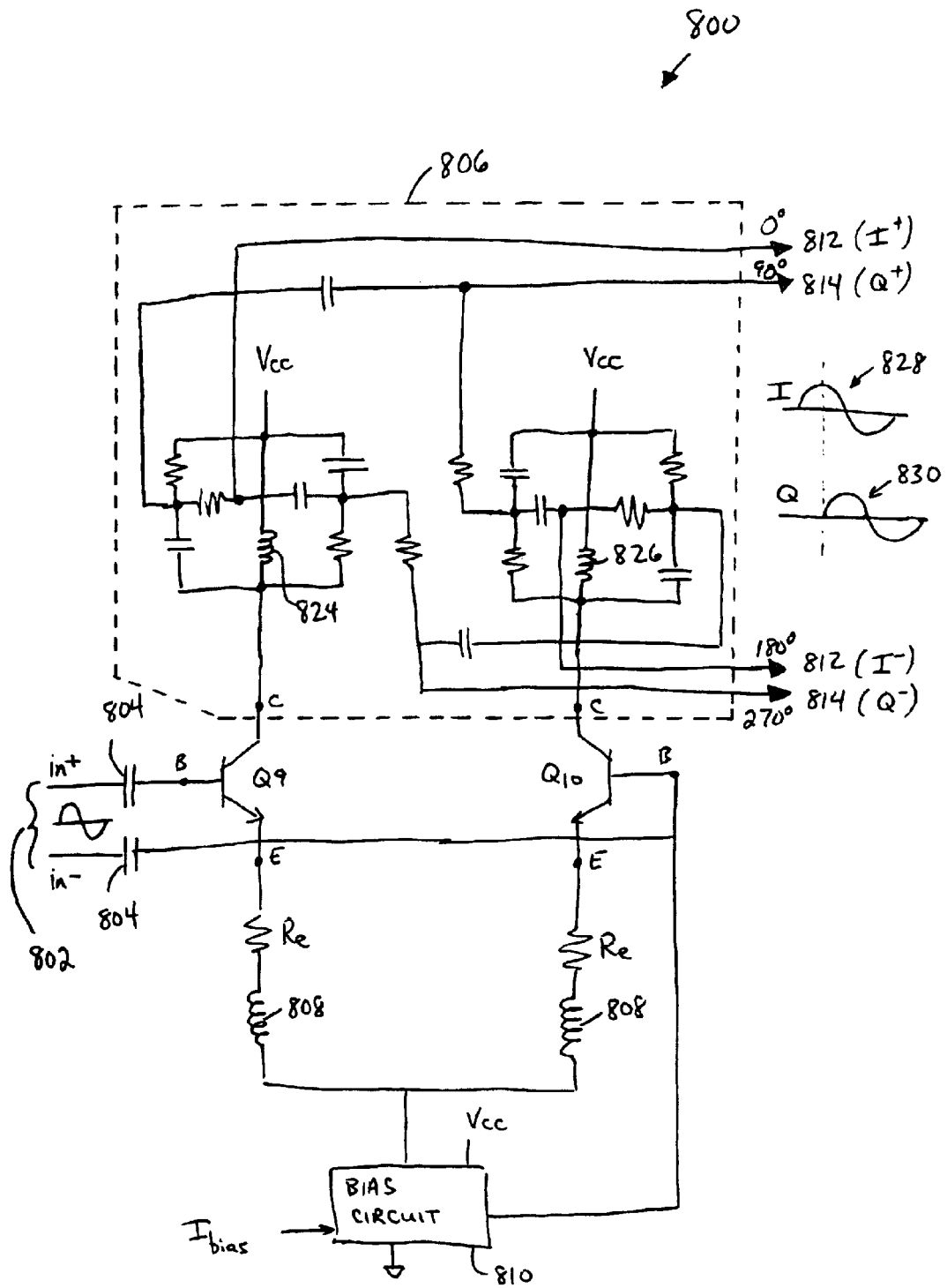
FIG. 8 is a circuit diagram of one embodiment of the R-C polyphase network of FIG. 7B and used for example, in one embodiment of the frequency doubler of FIG. 1.

Referring next to FIG. 8, a circuit diagram is shown of one embodiment of the R-C polyphase network of FIG. 7B and used for example, in one embodiment of the frequency doubler of FIG. 1. The R-C polyphase network circuit 800 includes input signal 802 (e.g., input signal 114) coupled to a pair of transistors (i.e., transistor Q9 and transistor Q10) via coupling capacitors 804, an R-C polyphase network 806 (also referred to simply as polyphase network 806, a polyphase filter or a phase-sequence network) coupled to the collectors of the transistors Q9 and Q10, emitter resistors Re, emitter inductors 808, a bias circuit 810 and outputs 812 and 814 (e.g., output signals 116 and 118). As is well understood in the art, each transistor is illustrated as a bipolar junction transistor (BJT) having a base B, collector C and emitter E in the common emitter (CE) configuration.

As illustrated, the input signal 802 is shown as a sinusoidal waveform, the positive component coupled to Q9 and the negative component coupled to Q10. The coupling capacitors 804 act to AC couple the circuit to any previous stages and to block any DC components. Vcc provides DC voltage to the polyphase network 806 collectors and to the bias circuit 810. The bias circuit 810 inputs bias current bias from a power supply (e.g., the power supply circuit 112) to provide the proper bias currents at the base of each transistor Q9 and Q10 to cause each transistor to become a current source. The small value emitter inductors 808 are coupled in series to the emitter resistors Re and are provided to improve distortion to compensate for tolerance changes. The operation of the proper bias circuit 810 needed to operate transistors Q9 and Q10 is well understood in the art.

The polyphase network 806 comprises a traditional two pole R-C polyphase network however with the addition of shunt inductors 824, 826 each coupled in parallel to an input of the polyphase network 806 (similar to the network 710 of FIG. 7B) in order to provide bandpass filtering or shaping in order to reduce unwanted harmonics and spurious content; thus, to maintain a better phase output. Thus, shunt inductor 824 is coupled in parallel with the positive component of the input signaling while shunt inductor 826 is coupled in parallel with the negative component of the input signaling. As such, the polyphase network 806 produces positive and negative components of the two outputs, which are offset by approximately 90 degrees (e.g., $I^+$, $I^-$ and $Q^+$, $Q^-$). Waveforms 828 illustrates output 812 (I) while waveform 830 illustrates output 814 (Q). As seen, output signal 814 is approximately 90 degrees offset from output signal 812.

A traditional R-C polyphase network such as illustrated in FIG. 7A is driven by the emitter follower (EF) stage of a bipolar junction transistor, i.e., each input of the polyphase network is taken at the emitter of a respective transistor. As such, a low impedance input is provided to a high impedance R-C polyphase network 700. The output is a low pass frequency response due to the resistance and capacitance of the network.

In contrast, in this embodiment, the polyphase network 806 is coupled to the collector of the transistors Q9 and Q10 in a common emitter configuration with the additional shunt inductors. In this case, the impedance is high at the collector creating a current source. Thus, the input to the polyphase network 806 is a high impedance source. The shunt inductors 824 and 826 provide an additional filtering on the high side of the frequency response to produce bandpass filtering. Thus, the output creates a resonant frequency that is close to the desired frequency. In other words, unwanted harmonics and spurious content are filtered by the polyphase network 806 to produce a more pure output. In contrast, the traditional polyphase network 700 only provides a low pass response and does not filter higher frequencies.

Furthermore, as would be appreciated in the art, the addition of a similar shunt inductor to the known polyphase network of FIG. 7A in the emitter follower configuration would not be effective due to the low impedance at the emitter. Additionally, since the shunt inductors 824 and 826 are at a high impedance point, amplification of the input signal is also provided in additional to selectivity (filtering).

Thus, according to several embodiments, the polyphase network 806 is placed at the collector terminal which provides amplification of the output signal in comparison to locating the polyphase network in the emitter follower configuration. Furthermore, a shunt inductor is added in parallel to each input of the polyphase network 806 which increases the impedance at the collector which further increases the amplification, resulting in a better signal to noise ratio. Additionally, the shunt inductors are selected so that they are in resonance with the capacitive reactance of the polyphase network in order to provide bandpass shaping of the output signal, in addition to outputs offset in phase. Advantageously, the polyphase network helps to reject incoming undesirable spurious content and harmonics. Furthermore, this polyphase network reduces circuit complexity and power consumption, as well as improves phase performance in comparison to traditional approaches. Reduced complexity and power consumption are particularly advantageous in integrated circuit implementations.

It is noted that such a polyphase network may be implemented at the input to a frequency multiplier circuit, such as described above with reference to FIGS. 1–6. However, it is understood that the polyphase network may be implemented in other applications (e.g., as an input to a mixer stage) and is particularly well suited to applications requiring little phase offset.

Figure 9:
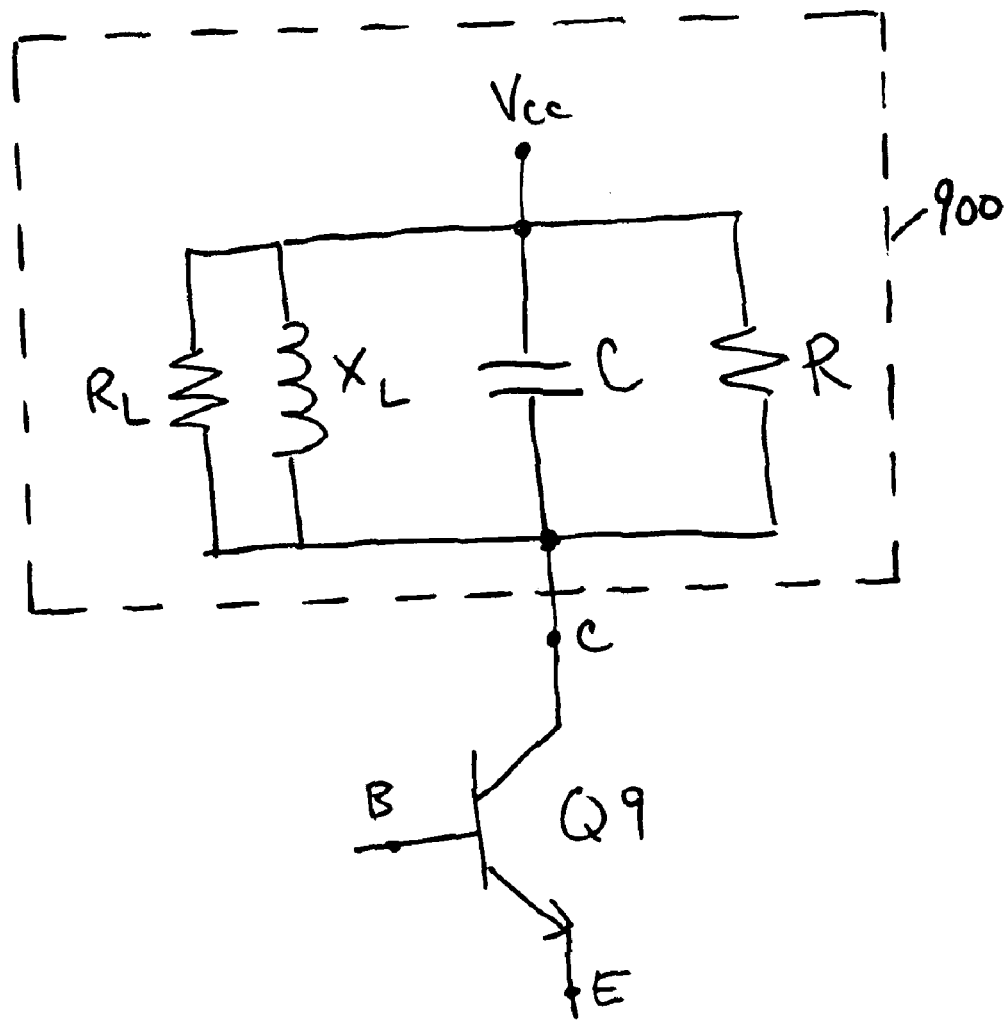
FIG. 9 is an equivalent circuit diagram of the R-C polyphase network of FIG. 8 from the viewpoint of the input at the collector of each transistor device of FIG. 8.

Referring next to FIG. 9, an equivalent circuit diagram is shown of the polyphase network 806 of FIG. 8 from the viewpoint of the input at the collector of each transistor. That is, from the viewpoint of the collector of each transistor Q9 and Q10, the polyphase network 806 appears and behaves as the equivalent circuit 900. A conventional R-C polyphase network behaves as a resistor (R) in parallel with a capacitor (C) and provides low pass filtering. The additional shunt inductor (illustrated as having a resistance $R_L$ and a reactance $X_L$) according to several embodiments of the invention is coupled in parallel to the input of the conventional R-C polyphase network, such as equivalently illustrated in FIG.

9. Thus, the improved polyphase network takes advantage of residual capacitive reactance in the conventional polyphase network. In preferred embodiments, the inductor is selected such that it is in resonance with the capacitive reactance of the R-C polyphase network, i.e., the inductor resonates with the effective shunt capacitance of the polyphase network. This provides bandpass filtering in the output signal. In such case, it is recognized that the inductor is not an ideal inductor and that it includes a resistance $R_L$ and reactance $X_L$. The loaded quality factor $Q_L$ of the inductor can be expressed as:

$$Q_L = \frac{R\|R_L}{X_L} \qquad \text{Eq. (10)}$$

solving for $X_L$, the reactance (and thus the inductance value) of the shunt inductor can be determined to operate the polyphase network at a given Q where:

$$X_L = \frac{R\|R_L}{Q_L} \qquad \text{Eq. (11)}$$

Thus, the shunt inductor takes advantage of the residual capacitive reactance, such that the inductor preferably operates in resonance therewith. Additionally, amplification is provided since voltage gain Vg at the collector is a function of the current gain $g_m$ and the impedance of the inductor $Z_L$ and can be expressed as:

$$Vg = g_m Z_L \qquad \text{Eq. (12)}$$

Thus, the increased impedance due to the presence of the inductor provides further amplification to the output signal, in addition to that provided by the fact that the polyphase network is coupled to the collector of the transistors.

Figure 10:
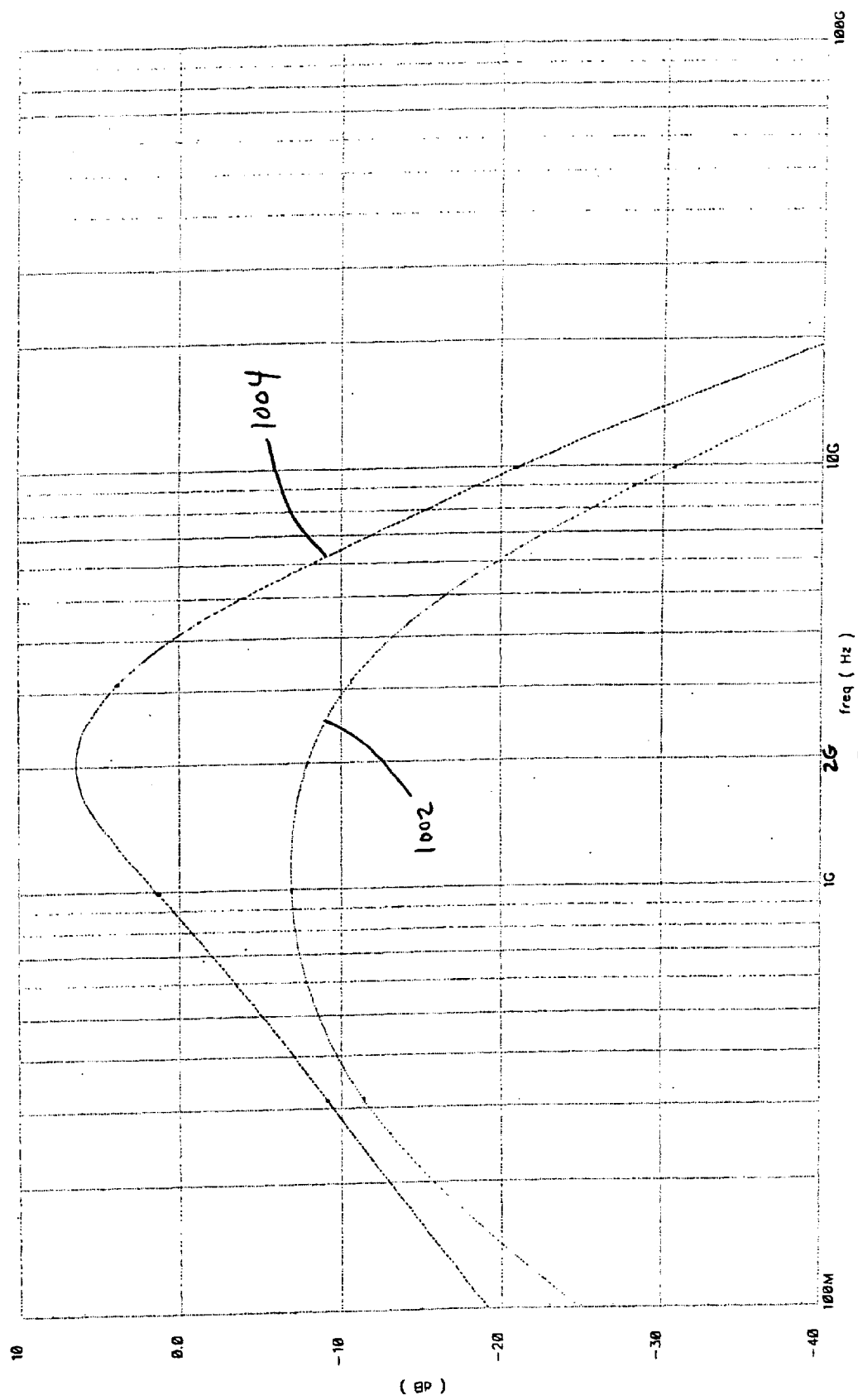
FIG. 10 is a frequency response plot of the R-C polyphase network of FIGS. 8 and 9 in comparison to that of a conventional R-C polyphase network.

Referring next to FIG. 10, a frequency response plot is shown for the polyphase network 806 of FIG. 8 in comparison to that of a conventional polyphase network. The response of a conventional polyphase network (e.g., polyphase network 700) is illustrated as line 1002, while the response of the improved polyphase network (e.g., polyphase network 806) such as described herein is illustrated as line 1004. As can be seen, with an input signal having a frequency of about 2 GHz, there is over a 10 dB improvement in rejection performance. Furthermore, in computer simulations of an improved polyphase network such as described herein, with a pure since wave input, the quadrature output was exactly at 90 degrees (i.e., zero phase offset). Even with the input degraded, e.g., by including a 14 dBc $2^{nd}$ harmonic and a 21 dBc $3^{rd}$ harmonic at the input (such as would be common at the output of a conventional rectifier type doubler), the quadrature offset was about 3.2 degrees. This is a significant improvement over conventional polyphase networks, which may have an offset of as much as 7 degrees. Additionally, in an implementation such as that shown in FIG. 1 where a second polyphase network is used at the output of the frequency doubler portion 106 for image rejection, the resulting phase offset at the second polyphase network was reduced to 0.7 degrees, which should meet the requirements of some of the most stringent wireless communication systems.

Figure 11:
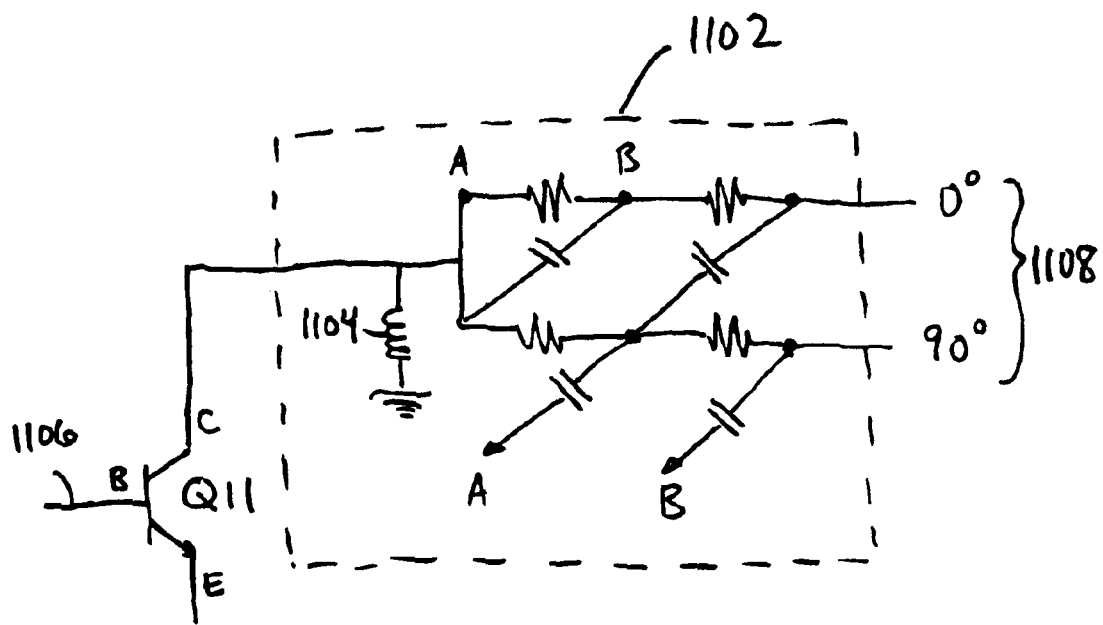
FIG. 11 is a circuit diagram of an R-C polyphase network in accordance with another embodiment of the invention.

Referring next to FIG. 11, a circuit diagram is shown of an R-C polyphase network in accordance with another embodiment of the invention. In this embodiment, the input of the polyphase network 1102 is not differential, thus, only one transistor device is used to drive the polyphase network. For example, an input signal 1106 to be doubled is coupled to the base of a single transistor device Q11 to drive a polyphase network 1102 having one input coupled to the collector of the single transistor device Q11. As described above, an inductor 1104 is coupled in parallel to the input of the polyphase network 1102 and is selected to resonate with the capacitive reactance of the polyphase network 1102 in order to provide bandpass filtering of the output 1108. In this embodiment, the polyphase network 1102 is a two stage network and the output 1108 has a component at 0 degrees and an output at 90 degrees. It is also noted that the polyphase network 1102 also functions as the equivalent diagram of FIG. 9 from the viewpoint of the collector of Q11.

While the invention herein disclosed has been described by means of specific embodiments and applications thereof, numerous modifications and variations could be made thereto by those skilled in the art without departing from the scope of the invention set forth in the claims.

What is claimed is:

1. A frequency doubler device comprising:
a first rectifier doubler stage adapted to receive a first input signal having a first frequency and adapted to output a first rectified signal having multiple harmonics;
a second rectifier doubler stage adapted to receive a second input signal having the first frequency and offset in phase from the first input signal and adapted to output a second rectified signal, wherein the second rectified signal has the multiple harmonics and is offset in phase from the first rectified signal, wherein the second input signal is offset in phase by approximately 90 degrees from the first input signal; and
a differential amplifier stage coupled to the first rectifier doubler stage and the second rectifier double stage and adapted to sum the first rectified signal and the second rectified signal to produce an output signal, wherein the output signal includes a desired output harmonic having a frequency that is double the first frequency, wherein the summing results in a substantial cancellation of unwanted output harmonics in the output signal.

2. The device of claim 1 wherein the output signal includes even output harmonics and odd output harmonics, wherein the summing results in the substantial cancellation of the even output harmonics in the output signal.

3. The device of claim 2 wherein the even output harmonics are reduced at least 20 dBc relative the desired output harmonic.

4. The device of claim 2 wherein a first even output harmonic is reduced at least 20 dBc relative to the desired output harmonic.

5. The device of claim 1 wherein summing of the differential amplifier stage results in at least a 20 dBc reduction of an unwanted output harmonic relative to the desired output harmonic of the output signal.

6. The device of claim 1 wherein summing of the differential amplifier stage results in at least a 40 dBc reduction of en unwanted output harmonic relative to the desired output harmonic of the output signal.

7. The device of claim 1 further comprising:
a polyphase network adapted to receive a signal having the first frequency and output the first input signal and the second input signal.

8. The device of claim 1 wherein the differential amplifier stage comprises a first transistor and a second transistor, the first rectified signal coupled to a base of the first transistor, the second rectified signal coupled to a base of the second transistor.

9. The device of claim 8 wherein the output signal is taken across collector terminals of the first transistor and the second transistor.

10. The device of claim 1 further comprising an integrated circuit device, the first rectifier doubler stage, the second rectifier doubler stage and the differential amplifier stage implemented within the integrated circuit device.

11. A frequency multiplier device comprising:
   a first rectifier stage adapted to receive a first input signal having a first frequency and adapted to output a first rectified signal having multiple harmonics;
   a second rectifier stage adapted to receive a second input signal having the first frequency and offset in phase from the first input signal and adapted to output a second rectified signal, wherein the second rectified signal has the multiple harmonics and is offset in phase from the first rectified signal, wherein the second input signal is offset in phase by approximately 90 degrees from the first input signal; and
   a differential amplifier stage coupled to the first rectifier stage and the second rectifier stage and adapted to sum the first rectified signal and the second rectified signal to produce an output signal, wherein the output signal includes a desired output harmonic having a frequency that is a multiple of the first frequency, wherein the summing results in a substantial cancellation of unwanted output harmonics in the output signal.

12. The device of claim 11 further comprising:
   a polyphase network adapted to receive a signal having the first frequency and output the first input signal and the second input signal.

13. The device of claim 11 wherein summing of the differential amplifier stage results in at least a 20 dBc reduction of an unwanted output harmonic relative to the desired output harmonic of the output signal.

14. The device of claim 11 wherein summing of the differential amplifier stage results in at least a 40 dBc reduction of an unwanted output harmonic relative to the desired output harmonic of the output signal.

15. The device of claim 11 wherein the first rectifier stage comprises a first rectifier double stage and the second rectifier stage comprises a second rectifier doubler stage;
   wherein the output signal includes the desired output harmonic having a frequency that is double the first frequency.

16. The device of claim 11 further comprising an integrated circuit device, the first rectifier stage, the second rectifier stage and the differential amplifier stage implemented within the integrated circuit device.

17. A method of frequency multiplication comprising the steps of:
   doubling a first input signal having a first frequency to produce a first doubled signal having a second frequency and multiple harmonics, the second frequency approximately twice the first frequency;
   doubling a second input signal having the first frequency and offset in phase from the first input signal to produce a second doubled signal, wherein the second doubled signal has the second frequency and the multiple harmonics and is offset in phase from the first doubled signal, wherein the second input signal is offset in phase by approximately 90 degrees from the first input signal; and
   summing the first doubled signal and the second doubled signal to produce an output signal including a desired output harmonic having the second frequency, wherein the summing results in a substantial cancellation of unwanted output harmonics in the output signal.

18. The method of claim 17 wherein the output signal includes even output harmonics and odd output harmonics, wherein the summing results in the substantial cancellation of the even output harmonics in the output signal.

19. The method of claim 18 wherein the summing results in at least a 20 dBc reduction of the even output harmonics relative to the desired output harmonic.

20. The method of claim 17 wherein the summing results in at least a 20 dBc reduction of a first even output harmonic relative to the desired output harmonic.

21. The method of claim 17 wherein summing results in at least a 20 dBc reduction of an unwanted output harmonic relative to the desired output harmonic.

22. The method of claim 17 wherein summing results in at least a 40 dBc reduction of an unwanted output harmonic relative to the desired output harmonic.

23. The method of claim 17 further comprising:
   receiving a signal having the first frequency; and
   generating the first input signal and the second input signal from the signal, wherein the second input signal is offset in phase from the first input signal.

24. The method of claim 17 wherein the summing comprises summing the first doubled signal and the second doubled signal by:
   coupling the first doubled signal to a base of a first transistor of a differential amplifier;
   coupling the second doubled signal to a base of a second transistor of the differential amplifier; and
   taking the output of collectors of the first transistor and the second transistor to form the output signal.

25. The method of claim 17 wherein the doubling steps comprise:
   inputting the first input signal to a first rectifier doubler stage to produce the first doubled signal; and
   inputting the second input signal to a second rectifier doubler stage to produce the second doubled signal.

26. A method of frequency multiplication comprising the step of:
   multiplying a first input signal having a first frequency to produce a first multiplied signal having a second frequency and multiple harmonics, the second frequency a multiple of the first frequency;
   multiplying a second input signal having the first frequency and offset in phase from the first input sign to produce a second multiplied signal, wherein the second multiplied signal has the second frequency and the multiple harmonics and is offset in phase from the first multiplied signal, wherein the second input signal is offset in phase by approximately 90 degrees from the first input signal; and
   summing the first multiplied signal and the second multiplied signal to produce an output signal including a desired output harmonic having the second frequency, wherein the summing results in a substantial cancellation of unwanted output harmonics in the output signal.

* * * * *